US012563887B2

(12) United States Patent
Lu

(10) Patent No.: US 12,563,887 B2
(45) Date of Patent: Feb. 24, 2026

(54) LIGHT-EMITTING DEVICE WITH ELECTRON TRANSPORT LAYER AND INTERVENING LAYER, MANUFACTURING METHOD THEREOF, DISPLAY SUBSTRATE AND DISPLAY APPARATUS

(71) Applicants: Beijing BOE Technology Development Co., Ltd., Beijing (CN); BOE TECHNOLOGY GROUP CO., LTD., Beijing (CN)

(72) Inventor: Zhigao Lu, Beijing (CN)

(73) Assignees: Beijing BOE Technology Development Co., Ltd., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 451 days.

(21) Appl. No.: 18/022,153

(22) PCT Filed: Apr. 28, 2022

(86) PCT No.: PCT/CN2022/089852
§ 371 (c)(1),
(2) Date: Feb. 19, 2023

(87) PCT Pub. No.: WO2023/206228
PCT Pub. Date: Nov. 2, 2023

(65) Prior Publication Data
US 2024/0292647 A1 Aug. 29, 2024

(51) Int. Cl.
*H10K 50/16* (2023.01)
*H10K 50/15* (2023.01)
(Continued)

(52) U.S. Cl.
CPC ............ *H10K 50/16* (2023.02); *H10K 50/15* (2023.02); *H10K 71/12* (2023.02); *H10K 71/60* (2023.02);
(Continued)

(58) Field of Classification Search
CPC ..... H10K 50/16; H10K 50/165; H10K 50/166
(Continued)

(56) References Cited

U.S. PATENT DOCUMENTS 9,768,404 B1 9/2017 Steckel et al.
2018/0006224 A1* 1/2018 Lee .................... H10K 85/6572
(Continued)

FOREIGN PATENT DOCUMENTS

CN 103700775 A 4/2014
CN 105449112 A 3/2016
(Continued)

OTHER PUBLICATIONS

European Patent Office, Extended European Search Report, Feb. 7, 2025, for corresponding EP application No. 22939080.2.

*Primary Examiner* — Quoc D Hoang
(74) *Attorney, Agent, or Firm* — HOUTTEMAN LAW LLC

(57) ABSTRACT

A light-emitting device including a first electrode and a second electrode opposite to each other, and a light-emitting layer and an electron transport layer therebetween, where the electron transport layer is between the first electrode and the light-emitting layer, a material of the electron transport layer includes a first metal oxide, the light-emitting device further includes an intervening layer on a side of the electron transport layer, the intervening layer including a second metal element, a form the second metal element in the intervening layer includes a form chemically bonded to the first metal oxide and a form of a metal simple substance; a
(Continued)

content of the second metal element in the second form is greater than a content of the second metal element in the first form; and the second metal element has an activity greater than an activity of the metal element in the first metal oxide.

20 Claims, 10 Drawing Sheets

(51) Int. Cl.
*H10K 71/12* (2023.01)
*H10K 71/60* (2023.01)
*H10K 85/60* (2023.01)
*H10K 102/00* (2023.01)

(52) U.S. Cl.
CPC ......... *H10K 85/615* (2023.02); *H10K 85/633* (2023.02); *H10K 85/6572* (2023.02); *H10K 2102/351* (2023.02)

(58) Field of Classification Search
USPC .......................................................... 257/40
See application file for complete search history.

(56) References Cited

U.S. PATENT DOCUMENTS

| | | | |
|---|---|---|---|
| 2019/0103571 | A1 | 4/2019 | Dong et al. |
| 2020/0067005 | A1 | 2/2020 | Park et al. |
| 2022/0123168 | A1 | 4/2022 | Li et al. |

FOREIGN PATENT DOCUMENTS

| | | | |
|---|---|---|---|
| CN | 106654027 | A | 5/2017 |
| CN | 109545996 | A | 3/2019 |
| CN | 110048009 | A | 7/2019 |
| CN | 110277501 | A | 9/2019 |
| CN | 110739404 | A | 1/2020 |
| CN | 111384257 | A | 7/2020 |
| CN | 111785843 | A | 10/2020 |
| CN | 112420971 | A | 2/2021 |
| CN | 113054120 | A | 6/2021 |
| CN | 113809255 | A | 12/2021 |
| CN | 113820923 | A | 12/2021 |
| CN | 113921731 | A | 1/2022 |
| JP | 2002100478 | A | 4/2002 |

* cited by examiner

Light-emitting device in first comparative example

Light-emitting device in second embodiment

LIGHT-EMITTING DEVICE WITH ELECTRON TRANSPORT LAYER AND INTERVENING LAYER, MANUFACTURING METHOD THEREOF, DISPLAY SUBSTRATE AND DISPLAY APPARATUS

TECHNICAL FIELD

The present disclosure relates to the field of display technology, and in particular, to a light-emitting device, a method of manufacturing a light-emitting device, a display substrate and a display apparatus.

BACKGROUND

A self-luminous display product includes a light-emitting device such as an OLED (Organic Light-emitting Diode) or a QLED (Quantum Dot Light-emitting Diode). The light-emitting device includes an anode, a cathode and a light-emitting layer located between the anode and the cathode. The light-emitting principle of the light-emitting device is as follows: holes injected from the anode and electrons injected from the cathode are combined in the light-emitting layer to form excitons, the excitons excite light-emitting molecules, and the excited light-emitting molecules emit visible light through radiation relaxation. A balance between the injection of electrons and the injection of holes has an important influence on the performance of the light-emitting device.

SUMMARY

The embodiments of present disclosure provide a light-emitting device, a method of manufacturing a light-emitting device, a display substrate and a display apparatus.

The present disclosure provides a light-emitting device, including a first electrode and a second electrode opposite to each other, and a light-emitting layer and an electron transport layer between the first electrode and the second electrode, where the electron transport layer is between the first electrode and the light-emitting layer, where a material of the electron transport layer includes a first metal oxide, the light-emitting device further includes an intervening layer on a side of the electron transport layer, the intervening layer including a second metal element, where an existing form of the second metal element in the intervening layer includes a first form and a second form, the first form includes a chemically bonded form, in which the second metal element is chemically bonded to the first metal oxide, and the second form includes a form of a metal simple substance; where a content of the second metal element in the second form is greater than a content of the second metal element in the first form; and the second metal element has an activity greater than an activity of the metal element in the first metal oxide.

In some embodiments, the first metal oxide includes at least one of ZnO, ZnMgO, ZnAlO, and ZnYO, and the second metal includes at least one of K, Ca, Na, Mg and Al.

In some embodiments, a content of the second metal element in the intervening layer gradually increases in a direction away from the electron transport layer.

In some embodiments, a molar ratio of the content of the second metal element in the chemically bonded form to a total amount of the second metal element in the intervening layer is in a range of 20% to 30%.

In some embodiments, the second form further includes a form of a metal oxide corresponding to the second metal element.

In some embodiments, the second metal elements in the chemically bonded form constitute a discontinuous layer.

In some embodiments, a roughness of a surface of the electron transport layer close to the intervening layer is a, and a thickness of the intervening layer is greater than or equal to a.

In some embodiments, a difference between the thickness of the intervening layer and a is less than or equal to 2 nm.

In some embodiments, a thickness of the electron transport layer is in a range of 20 nm to 25 nm.

In some embodiments, the light-emitting device further includes at least one hole transport layer between the light-emitting layer and the second electrode, where a material of each of the at least one hole transport layer includes at least one of the following compounds and derivatives of the following compounds:

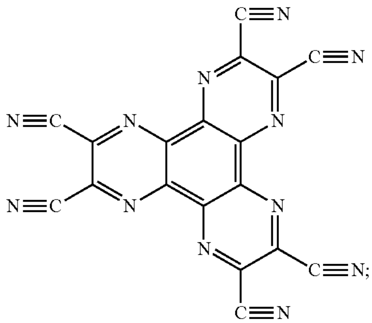
;
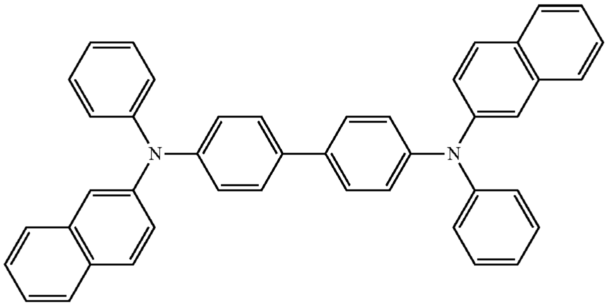
;

-continued
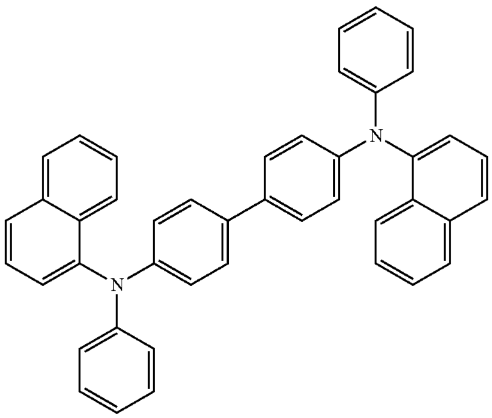
;
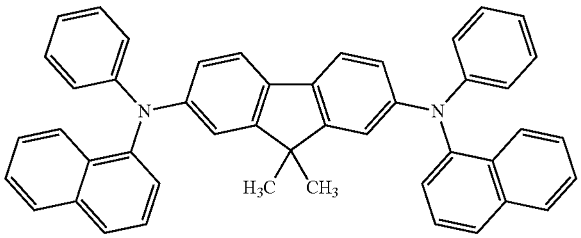
;
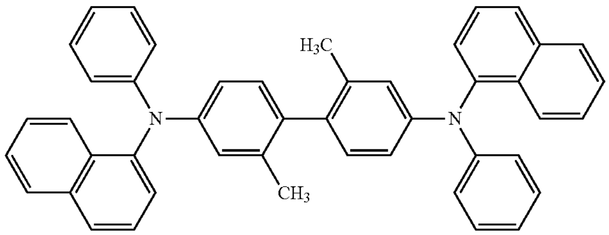
;
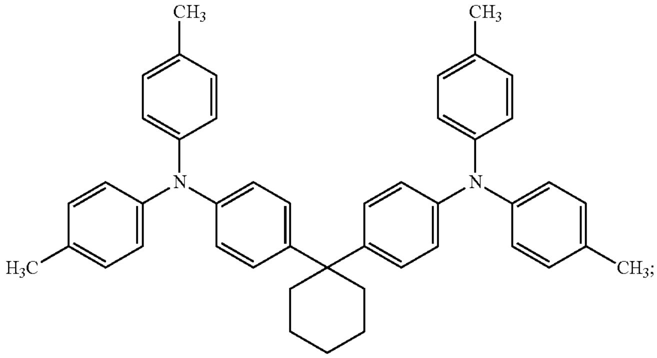
;
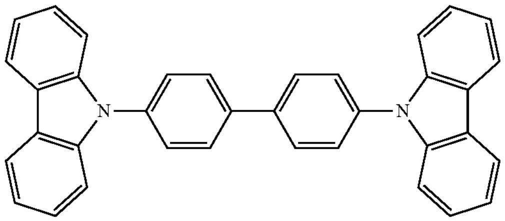
;
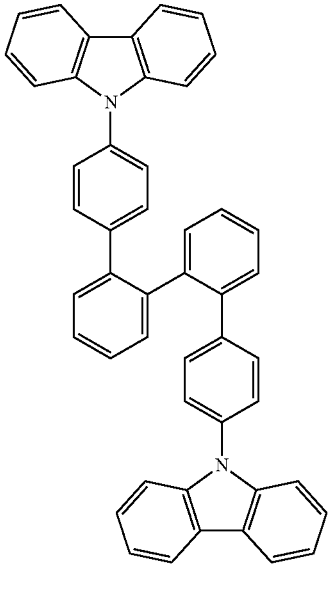
;

-continued

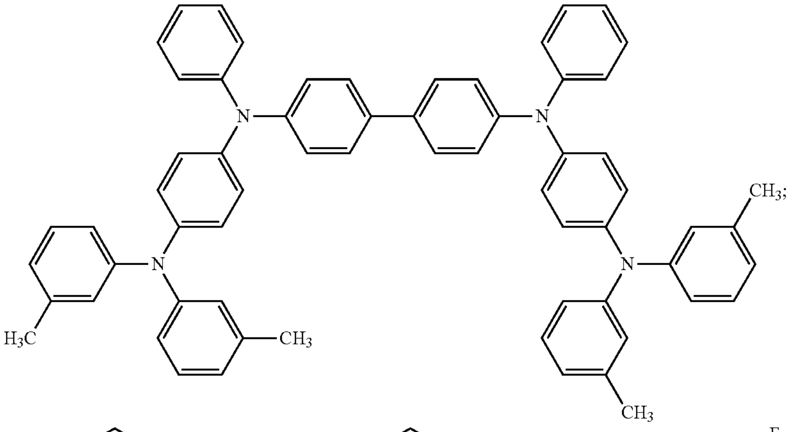

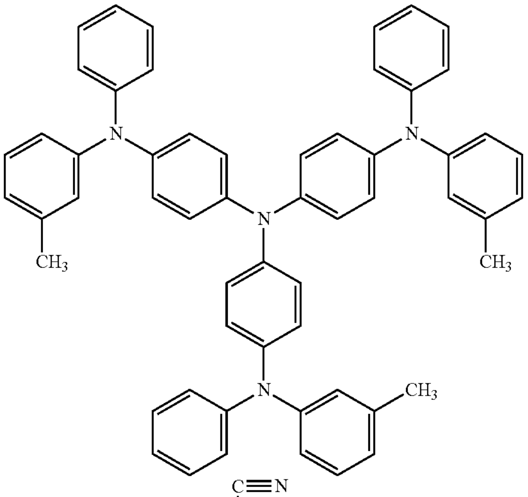

;

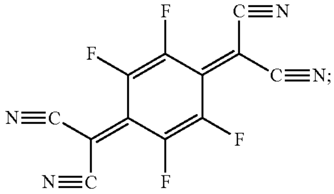

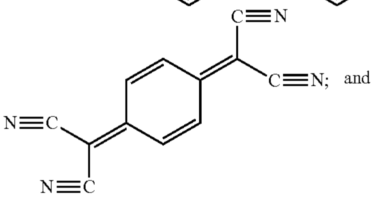

; and

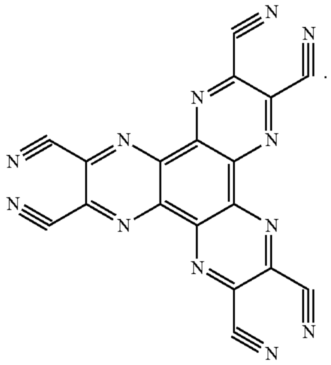

.

An embodiment of the present disclosure further provides a display substrate, including the light-emitting device described above.

An embodiment of the present disclosure further provides a display apparatus, including the display substrate described above.

An embodiment of the present disclosure further provides a method of manufacturing a light-emitting device, including:

forming a first electrode, a second electrode, a light-emitting layer, an electron transport layer and an intervening layer, where the first electrode and the second electrode are opposite to each other, the light-emitting layer is between the first electrode and the second electrode, the electron transport layer is between the first electrode and the light-emitting layer, the intervening layer is on a side of the electron transport layer, and a material of the electron transport layer includes a first metal oxide;

where a step of forming the intervening layer includes:

forming a metal material layer, where the metal material layer includes a second metal element, and the second metal element has an activity greater than an activity of a metal element in the first metal oxide, such that an existing form of the second metal element of the metal material layer includes a first form and a second form, the first form includes a form chemically bonded to the first metal oxide, and the second form includes a form of a metal simple substance;

where a content of the second metal element in the second form is greater than a content of the second metal element in the first form.

In some embodiments, the metal material layer is formed through evaporation.

In some embodiments, the electron transport layer has a thickness in a range of 20 nm to 25 nm.

In some embodiments, a step of forming the electron transport layer includes:

spin-coating an electron transmission solution, where a concentration of the electron transmission solution is in a range of 20 mg/mL to 40 mg/mL, and a spin-coating speed is in a range of 3500 r/min to 4500 r/min; and solidifying the electron transport solution, to form the electron transport layer.

BRIEF DESCRIPTION OF DRAWINGS

The accompanying drawings, which are included to provide a further understanding of the present disclosure and constitute a part of this specification, serve to explain the present disclosure together with the following detailed description, but do not constitute a limitation of the present disclosure. In the drawings.

DETAIL DESCRIPTION OF EMBODIMENTS

In order to make the objects, technical solutions and advantages of the embodiments of the present disclosure more apparent, the technical solutions of the embodiments of the present disclosure will be clearly and completely described below with reference to the drawings of the embodiments of the present disclosure. Obviously, the described embodiments are some, but not all, embodiments of the present disclosure. All other embodiments, which can be derived by one of ordinary skill in the art from the described embodiments of the present disclosure without creative efforts, are within the protection scope of the present disclosure.

The term used herein to describe embodiments of the present disclosure is not intended to limit and/or define the scope of the present disclosure. For example, unless otherwise defined, a technical or scientific term used herein shall have the ordinary meaning as understood by one of ordinary skill in the art to which the present disclosure belongs. It should be understood that the terms "first", "second", and the like, as used in the present disclosure, do not denote any order, quantity, or importance, but rather are used to distinguish one element from another. The singular form "a", "an", or "the" and the like does not denote a limitation of quantity, but rather denotes the presence of at least one, unless the context clearly dictates otherwise. The word "comprising" or "comprises", and the like, means that the element or item appearing in front of the word "comprising" or "comprises" includes the element or item listed after the word "comprising" or "comprises" and its equivalents, and does not exclude other elements or items. The term "connected" or "coupled" and the like is not restricted to a physical or mechanical connection, but may include an electrical connection, whether direct or indirect. The terms "upper", "lower", "left", "right", and the like are used merely to indicate relative positional relationships, which may also change accordingly when the absolute position of the object being described changes.

In the following description, when an element or layer is referred to as being "on" or "connected to" another element or layer, it may be directly on, connected to, or intervening elements or layers may be present. However, when an element or layer is referred to as being "directly on" or "directly connected to" another element or layer, there are no intervening elements or layers present. The term "and/or" includes any and all combinations of one or more of the associated listed items.

Figure 1:
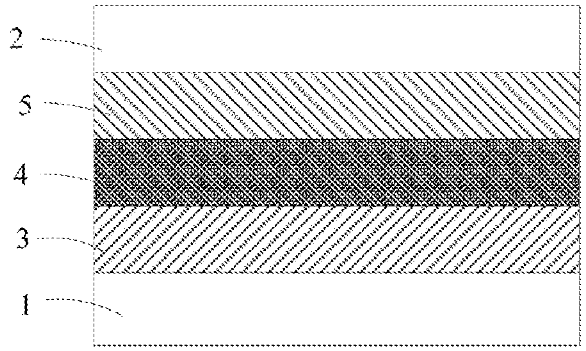
FIG. 1 is a schematic diagram of a light-emitting device provided in an example.

A self-luminous display product includes a light-emitting device such as an OLED (Organic Light-emitting Diode) or a QLED (Quantum Dot Light-emitting Diode). FIG. 1 is a schematic diagram of a light-emitting device provided in an example. As shown in FIG. 1, the light-emitting device includes an anode 1, a cathode 2 and an electron transport layer 3, a light-emitting layer 4, and a hole transport layer 5 located between the anode 1 and the cathode 2. The light-emitting principle of the light-emitting device is as follows: holes injected from the anode 1 and electrons injected from the cathode 2 are combined in the light-emitting layer 4 to form excitons, the excitons excite light-emitting molecules, and the excited light-emitting molecules emit visible light through radiation relaxation. A balance between the injection of electrons and the injection of holes has an important influence on the performance of the light-emitting device.

In most QLED devices, the injection of electrons is greater than the injection of holes. In order to reduce the injection of electrons, in some examples, an electron blocking layer is arranged on the electron transport layer 3 to reduce the injection of electrons, and the electron blocking layer is made of a material such as PEIE (polyethoxyethyleneimine), PMMA (polymethyl methacrylate), or the like. When the material of the electron transport layer is a metal oxide, for example, a nano-material such as ZnO, ZnMgO, etc., since the nano-material has a small size, the problem of dangling bonds and lattice mismatch existing on the surface of the nano-material may cause that defects are prone to occur on the surface of the electron transport layer 3. Since the material such as PEIE or PMMA is completely different from the material of the electron transport layer 3, the defects on the surface of the electron transport layer 3, which also affect the performance of the light-emitting device, cannot be improved.

Figure 2A:
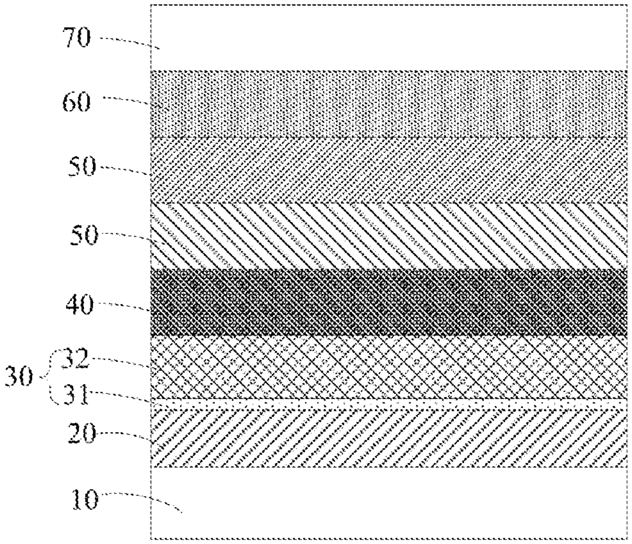
FIG. 2A is a schematic diagram of a light-emitting device provided in some embodiments of the present disclosure.

FIG. 2A is a schematic diagram of a light-emitting device provided in some embodiments of the present disclosure. As shown in FIG. 2A, the light-emitting device includes a first electrode 10, a second electrode 70, a light-emitting layer 40, an electron transport layer 20, and an intervening layer 30.

The first electrode 10 and the second electrode 70 are arranged opposite to each other, the first electrode 10 may be a cathode, and the second electrode 70 may be an anode. In addition, the material of the first electrode 10 and the second electrode 70 is not particularly limited in the present disclosure, for example, the material of the first electrode 10 includes a transparent material such as Indium Tin Oxide (ITO); and the material of the second electrode 70 includes a metal material.

The light-emitting layer 40 and the electron transport layer 20 are located between the first electrode 10 and the second electrode 70. Optionally, the light-emitting device is a QLED device, in which case the light-emitting layer 40 is made of a quantum dot light-emitting material.

The electron transport layer 20 is located between the first electrode 10 and the light-emitting layer 40. The material of the electron transport layer 20 includes a first metal oxide, which may be a nanoscale material, such as a ZnO nano-material, a ZnMgO nano-material, or the like.

Figure 2B:
FIG. 2B is a scanning electron micrograph of a longitudinal section of a light-emitting device provided in some embodiments of the present disclosure.

The intervening layer 30 is located on a side of the electron transport layer 20 in a thickness direction of the electron transport layer 20, and the intervening layer 30 includes a second metal element. An existing form of the second metal element in the intervening layer 30 includes a first form and a second form, the first form includes a form chemically bonded to the first metal oxide, and the second form includes in a form of a metal simple substance. The content of the second metal element existing in the second form is greater than the content of the second metal element existing in the first form. The second metal is chemically bonded to the first metal oxide to form a second metal oxide layer 31, and the second metal existing in the second form constitutes an intervening body layer 32. The second metal element has an activity greater than that of the metal element in the first metal oxide. It should be noted that the above "content" refers to a molar content. The thicknesses of the layers in FIG. 2A do not represent a real ratio nor a real morphology, for example, the second metal oxide layer 31 may not necessarily be a continuous layer, but may be a discontinuous layer. The so-called "discontinuous layer" refers to a situation that a gap, a hollow, or the like exists in the layer. FIG. 2B is a scanning electron micrograph of a longitudinal section of a light-emitting device provided in some embodiments of the present disclosure, and as shown in FIG. 2B, the boundaries between the electron transport layer 20, the intervening layer 30, and the light-emitting layer 40 are not sharp.

When the intervening layer 30 is formed, a more active metal material layer may be formed on the surface of the electron transport layer 20, where the metal material layer includes second metal elements, and a part of the second metal elements close to the electron transport layer 20 are bonded to a dangling bond on the electron transport layer 20 to form a second metal oxide layer 31; and the other part of the second metal elements do not react with the electron transport layer 20.

In an embodiment of the present disclosure, a part of the second metal elements in the intervening layer 30 exist in a form of being chemically bonded to the first metal oxide. That is, the part of the second metal elements may react with the first metal oxide to form the second metal oxide layer 31, and the second metal oxide layer 31 can block electrons, thereby improving the performance of the light-emitting device. In addition, the second metal oxide layer 31 is a layer formed through a direct in-situ reaction of the second metal with the first metal oxide in the electron transport layer 20, so that oxygen dangling bonds on the surface of the electron transport layer 20 are reduced, the problem of defects on the surface of the electron transport layer 20 caused by the dangling bonds is further reduced, and the performance of the light-emitting device is further improved.

In addition, since the second metal oxide layer 31 is formed through the reaction of the second metal with the first metal oxide in the electron transport layer 20, a thickness of the second metal oxide layer 31 is low (for example, the second metal oxide layer 31 may be a monoatomic layer), so that the problem of the increase of the operating voltage of the light-emitting device does not occur. Further, the second metal oxide layer 31 and the surface of the electron transport layer 20 are chemically bonded to each other by sharing oxygen atoms, so that a contact between the second metal oxide layer 31 and the electron transport layer 20 is better.

In an embodiment of the present disclosure, the light-emitting device may be arranged on a base substrate, and the light-emitting device may be a normal light-emitting device or an inverted light-emitting device. That is, the second electrode 70 may be arranged on a side close to the base substrate, or the first electrode 10 may be arranged on the side close to the base substrate. The light-emitting device in the embodiment of the present disclosure will be described below by taking a case as an example, in which case, the first electrode 10 is arranged on the side close to the base substrate and the second electrode 70 is arranged on a side of the first electrode 10 away from the base substrate.

As shown in FIG. 2A, the light-emitting device includes a first electrode 10, an electron transport layer 20, an intervening layer 30, a light-emitting layer 40, at least one hole transport layer 50, a hole injection layer 60, and a second electrode 70, which are sequentially arranged in a direction away from the base substrate. The material of the electron transport layer 20 includes a first metal oxide nano-material; and the intervening layer 30 includes a second metal element. An existing form of the second metal element in the intervening layer 30 includes a first form and a second form, the first form includes a form chemically bonded to the first metal oxide, and the second form includes in a form of a metal simple substance. The content of the second metal element existing in the second form is greater than the content of the second metal element existing in the first form. The second metal is chemically bonded to the first metal oxide to form a second metal oxide layer 31, and the second metal existing in the second form constitutes an intervening body layer 32. The second metal element has an activity greater than that of the metal element in the first metal oxide.

In some embodiments, the first metal oxide may include at least one of ZnO, ZnMgO, ZnAlO, ZnYO, and the second metal may include at least one of active metals such as K, Ca, Na, Mg, Al, etc., thereby forming a second metal oxide such as $K_2O$, CaO, $Na_2O$, MgO, $Al_2O_2$, or the like.

During manufacturing the intervening layer 30, a metal material layer including the second metal may be formed on the surface of the electron transport layer 20, so that a part of the metal material layer close to the electron transport layer 20 reacts with the first metal oxide to form the second metal oxide layer 31, and the second metal element in the second metal oxide layer 31 exists in a form of being chemically bonded to the first metal oxide. For example, the first metal oxide in the electron transport layer 20 is ZnO, and the second metal element may be bonded to the ZnO, thereby forming ZnMgO.

In some embodiments, the second form further includes a form of a metal oxide corresponding to the second metal element. That is, in the second metal elements that does not react with the second metal oxide in the metal material layer, a part of the second metal elements exist in the form of a metal simple substance, and the other part of the second metal elements may react with oxygen in the manufacturing process of the light-emitting device, so that the second metal element exists in the form of a metal oxide. That is, the intervening body layer 32 is doped with a metal simple substance corresponding to the second metal element and a metal oxide corresponding to the second metal element.

In some embodiments, a molar ratio of the content of the second metal element in the form chemically bonded with the first metal oxide to the total amount of the second metal element in the intervening layer 30 is in a range of 20% to 30%. That is, 20% to 30% of the second metal in the metal material layer reacts directly in-situ with the first metal oxide, to exist in the form chemically bonded with the first metal oxide. In addition, in the intervening layer 30, the content of the second metal element may gradually increase in a direction away from the electron transport layer 20.

In the manufacturing process of the light-emitting device, a surface of the electron transport layer 20 close to the light-emitting layer 40 is inevitably uneven, and cracks are prone to occur in the electron transport layer 20 and the light-emitting layer 40, so that the lateral transport of electrons is influenced. However, on one hand, a part of materials in the intervening layer 30 can fill the crack of the electron transport layer 20, and on the other hand, the part of material in the intervening layer 30 can physically or chemically react with the material of the electron transport layer 30, so that an interface between the electron transport layer 30 and the intervening layer 30 can be improved, the performance and uniformity of the lateral current are improved, and the light-emitting uniformity of the light-emitting layer 40 is improved.

In some embodiments, a roughness of the surface of the electron transport layer 20 close to the light-emitting layer 40 is a, and the thickness of the intervening layer 30 is greater than or equal to a, so as to further improve the performance and uniformity of the lateral current, and improve the light light-emitting uniformity of the light-emitting layer 40. The roughness of a certain surface refers to a maximum value of a height difference between a protrusion and a depression of the surface.

Where the thickness of the intervening layer 30 is too great, when a material of the light-emitting layer 40 is spin-coated after the intervening layer 30 is formed, too much metal ions are prone to be doped into the light-emitting layer 40, which affects the light-emitting effect. Considering this situation, in some embodiments of the present disclosure, a difference between the thickness of the intervening layer 30 and a is less than or equal to 2 nm, thereby preventing the intervening layer 30 from affecting the light-emitting layer 40 while improving the lateral transport effect of electrons.

In some embodiments of the present disclosure, a material of the hole injection layer 60 may include MoOx. The light-emitting device may include a plurality of hole transport layers 50, for example, two hole transport layers. A material of each of the hole transport layers 50 includes at least one of the following compounds and derivatives of the compounds:

Compound 1
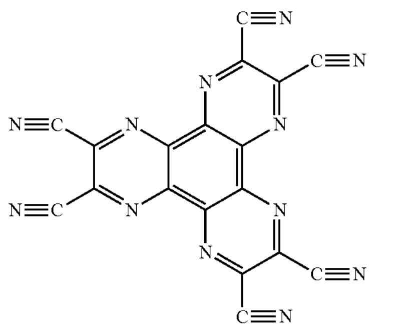
Compound 2
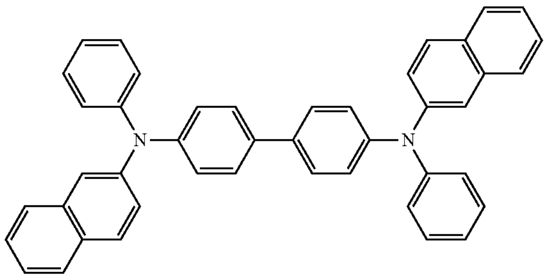
Compound 3
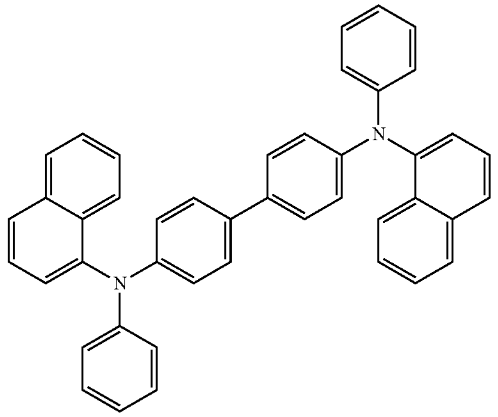
Compound 4
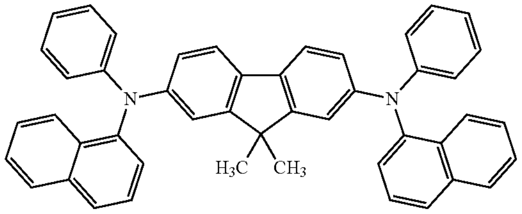
Compound 5
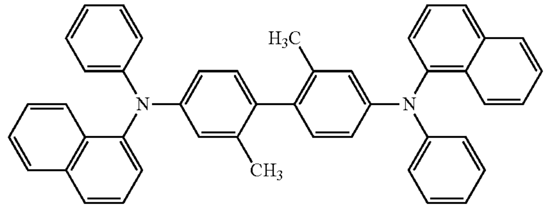
Compound 6
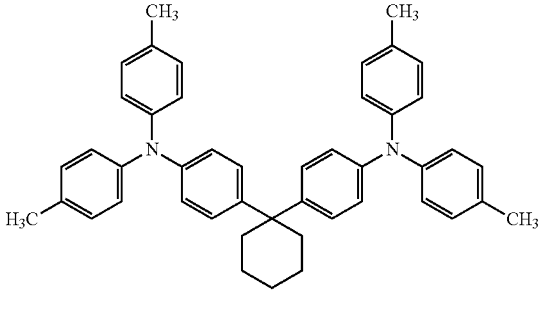

-continued
Compound 7
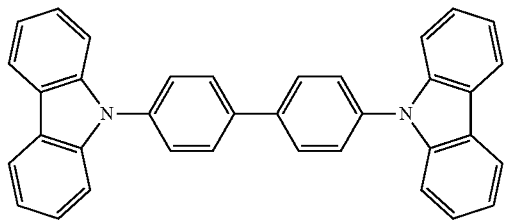
Compound 8
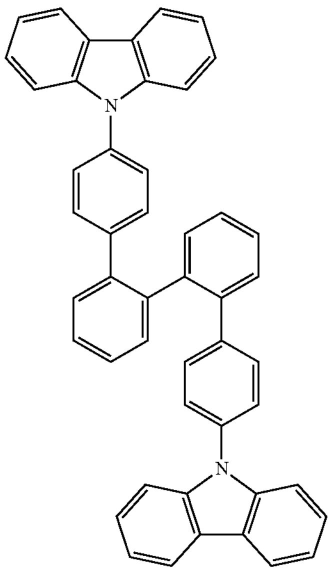
Compound 9
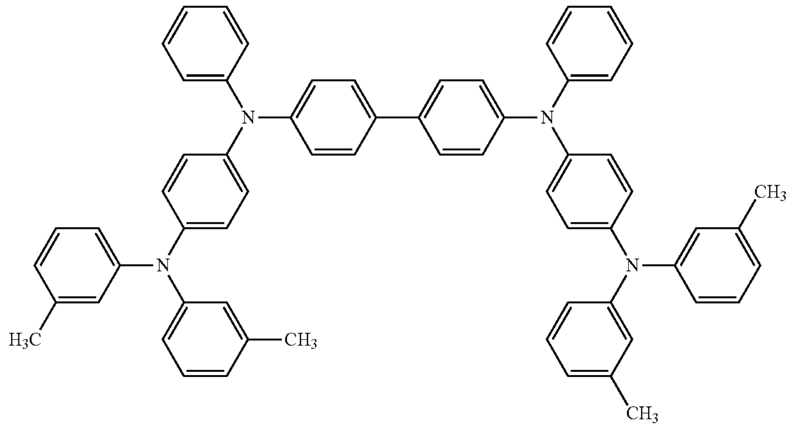
Compound 10
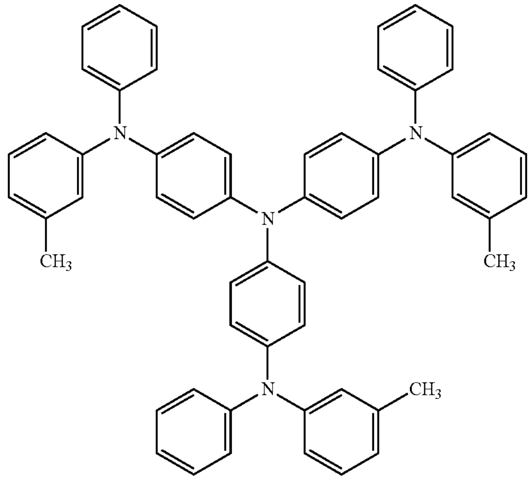
Compound 11
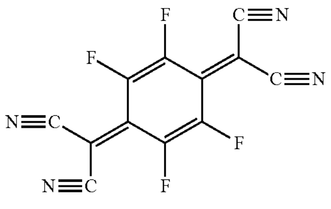

-continued

Compound 12

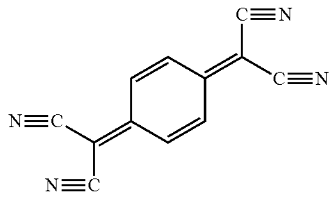

Compound 13

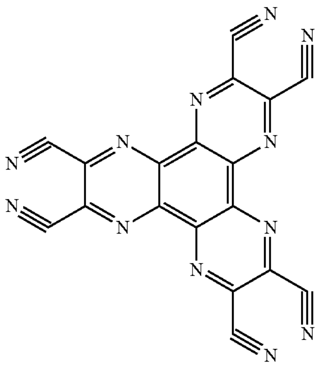

Figure 3A:
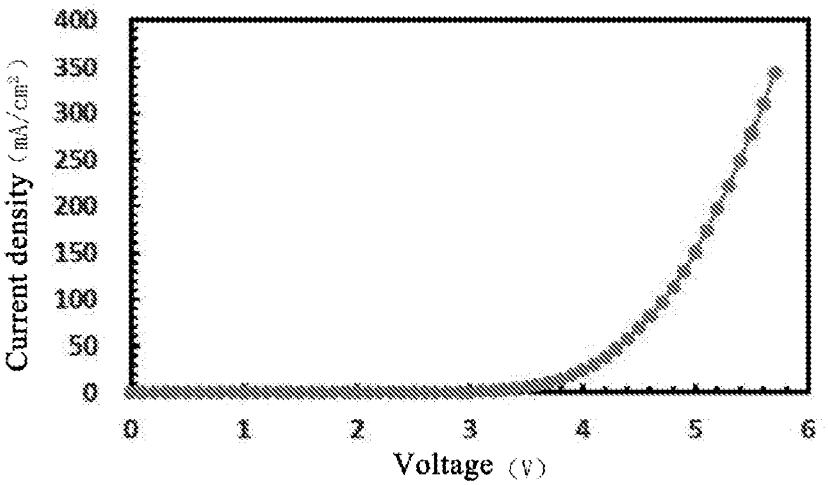
FIG. 3A illustrates a curve of a relationship between a current density and a voltage of a light-emitting device in a first comparative example.
Figure 3B:
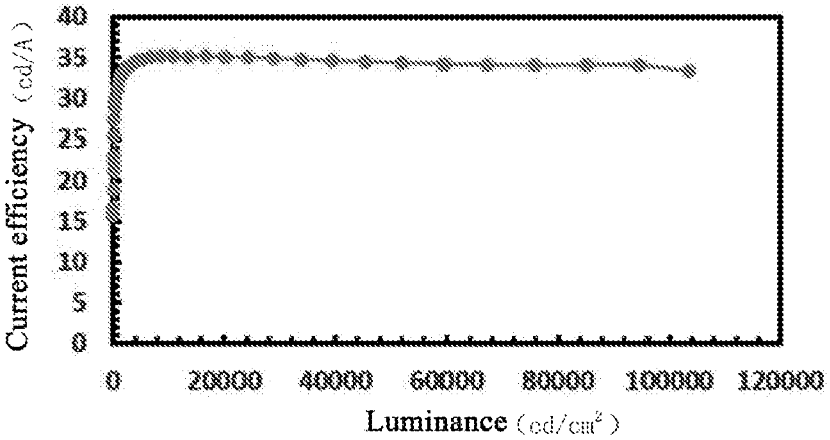
FIG. 3B illustrates a curve of a relationship between a current efficiency and a luminance of a light-emitting device in a first comparative example.
Figure 3C:
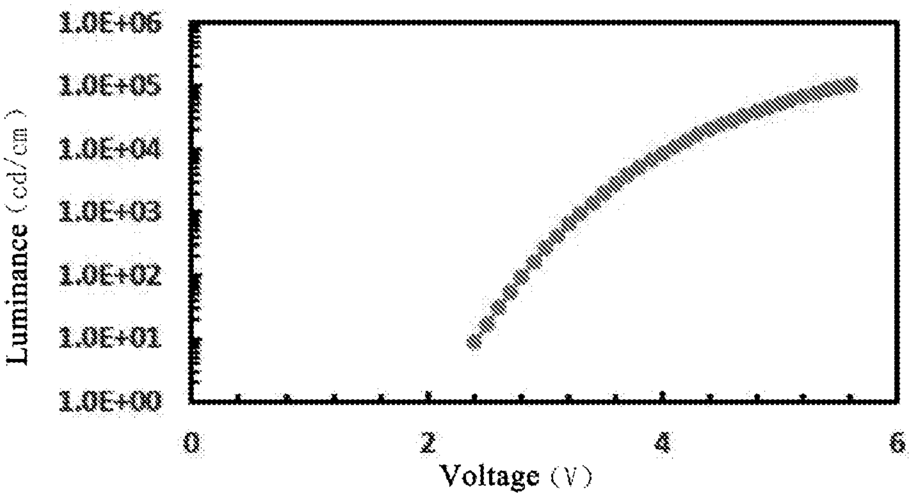
FIG. 3C illustrates a curve of a relationship between a luminance and a voltage of a light-emitting device in a first comparative example.

FIG. 3A illustrates a curve of a relationship between a current density and a voltage of a light-emitting device in a first comparative example, FIG. 3B illustrates a curve of a relationship between a current efficiency and a luminance of a light-emitting device in a first comparative example, and FIG. 3C illustrates a curve of a relationship between a luminance and a voltage of a light-emitting device in a first comparative example. The light-emitting device in a first comparative example includes a first electrode 10, an electron transport layer 20, a light-emitting layer 40, two hole transport layers 50, a hole injection layer 60, and a second electrode 70, which are stacked together, without an intervening layer. The electron transport layer 20 is made of ZnO, and has a thickness in a range of 20 nm to 25 nm. The hole transport layer 50 is made of at least one of the compounds described above and derivatives thereof. A material of the hole injection layer 60 includes MoOx.

Figure 4A:
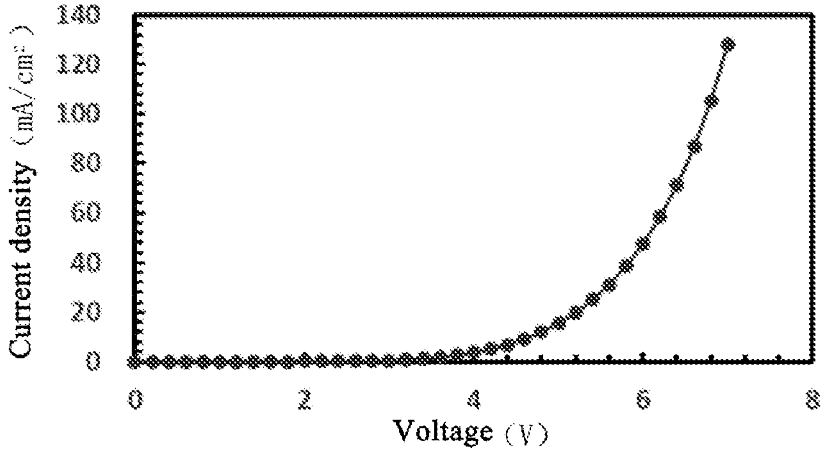
FIG. 4A illustrates a curve of a relationship between a current density and a voltage of a light-emitting device in a second comparative example.
Figure 4B:
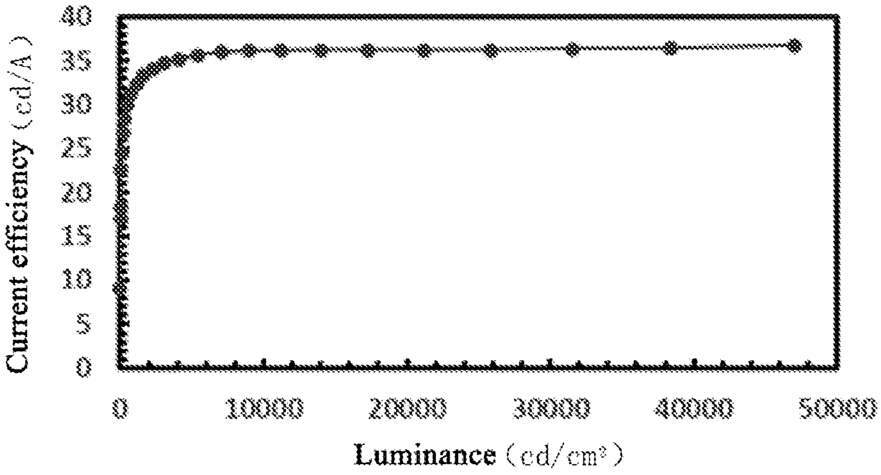
FIG. 4B illustrates a curve of a relationship between a current efficiency and a luminance of a light-emitting device in a second comparative example.
Figure 4C:
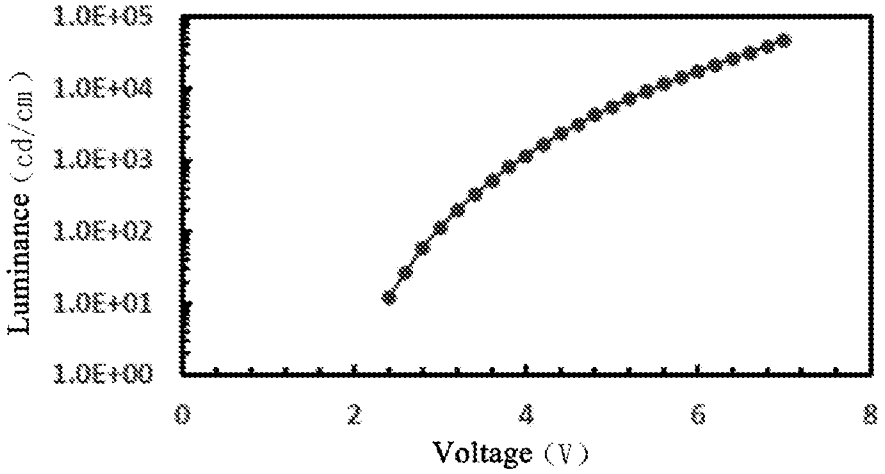
FIG. 4C illustrates a curve of a relationship between a luminance and a voltage of a light-emitting device in a second comparative example.

FIG. 4A illustrates a curve of a relationship between a current density and a voltage of a light-emitting device in a second comparative example, FIG. 4B illustrates a curve of a relationship between a current efficiency and a luminance of a light-emitting device in a second comparative example, and FIG. 4C illustrates a curve of a relationship between a luminance and a voltage of a light-emitting device in a second comparative example. The light-emitting device in the second comparative example is similar to the light-emitting device in the first comparative example, except that the electron transport layer 20 of the light-emitting device in the second comparative example is made of ZnMgO.

As can be seen from FIGS. 3A to 4C, in a case where the intervening layer 30 is not provided in the light-emitting device, whether the electron transport layer 20 is made of ZnO or ZnMgO does not greatly affect the current efficiency of the light-emitting device.

Figure 5A:
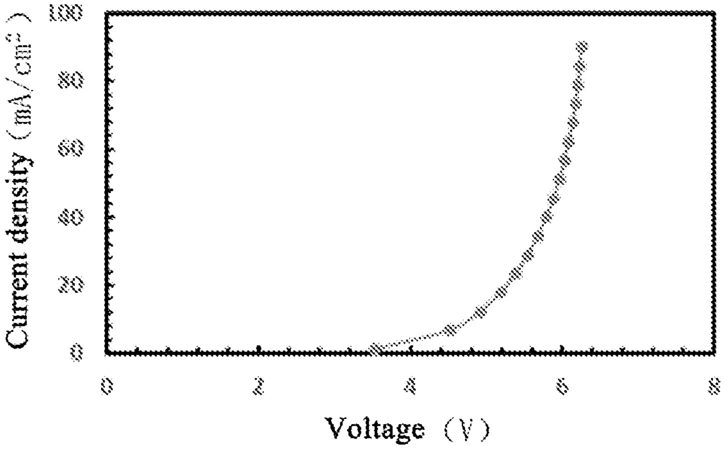
FIG. 5A illustrates a curve of a relationship between a current density and a voltage of a light-emitting device provided in a first embodiment of the present disclosure.
Figure 5B:
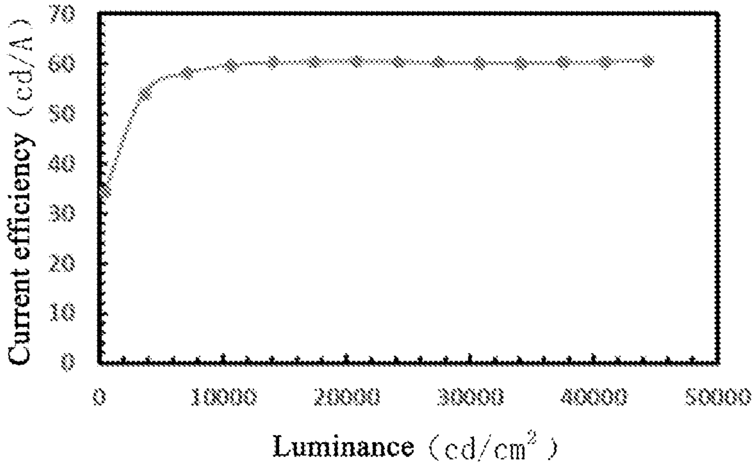
FIG. 5B illustrates a curve of a relationship between a current efficiency and a luminance of a light-emitting device provided in a first embodiment of the present disclosure.
Figure 5C:
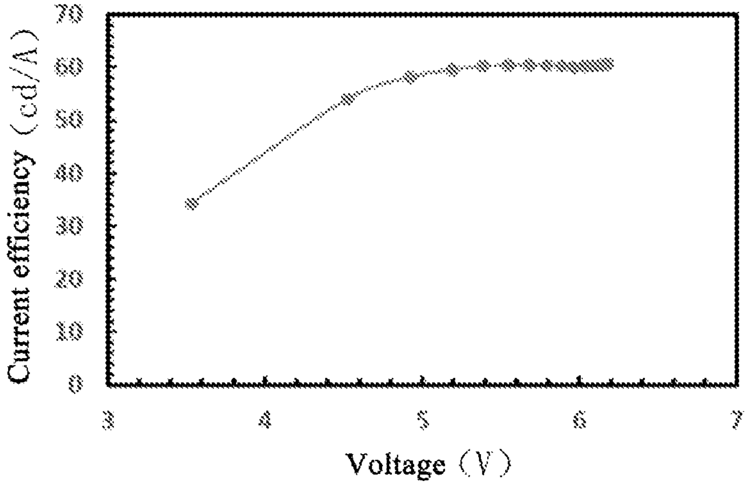
FIG. 5C illustrates a curve of a relationship between a current efficiency and a voltage of a light-emitting device provided in a first embodiment of the present disclosure.

FIG. 5A illustrates a curve of a relationship between a current density and a voltage of a light-emitting device provided in a first embodiment of the present disclosure, FIG. 5B illustrates a curve of a relationship between a current efficiency and a luminance of a light-emitting device provided in a first embodiment of the present disclosure, and FIG. 5C illustrates a curve of a relationship between a current efficiency and a voltage of a light-emitting device provided in the first embodiment of the present disclosure. The light-emitting device provided in the first embodiment of the present disclosure is similar to the light-emitting device in the first comparative example, except that the light-emitting device in the first embodiment further includes an intervening layer 30 arranged between the electron transport layer 20 and the light-emitting layer 40. Specifically, a Mg metal layer is formed on the surface of the electron transport layer 20, such that a part of the Mg metal layer close to the electron transport layer 20 (ZnO layer) forms a second metal oxide layer 31, and the other part of the Mg metal layer remains unchanged. The Mg metal layer has a thickness of 1 nm, and is formed through evaporation.

Figure 6A:
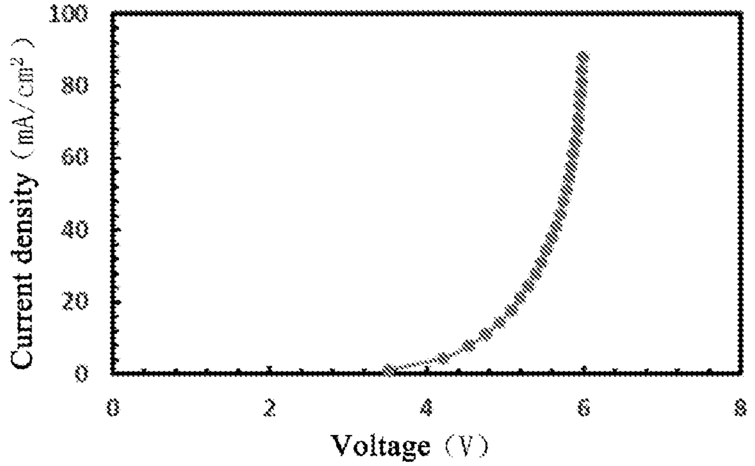
FIG. 6A illustrates a curve of a relationship between a current density and a voltage of a light-emitting device provided in a second embodiment of the present disclosure.
Figure 6B:
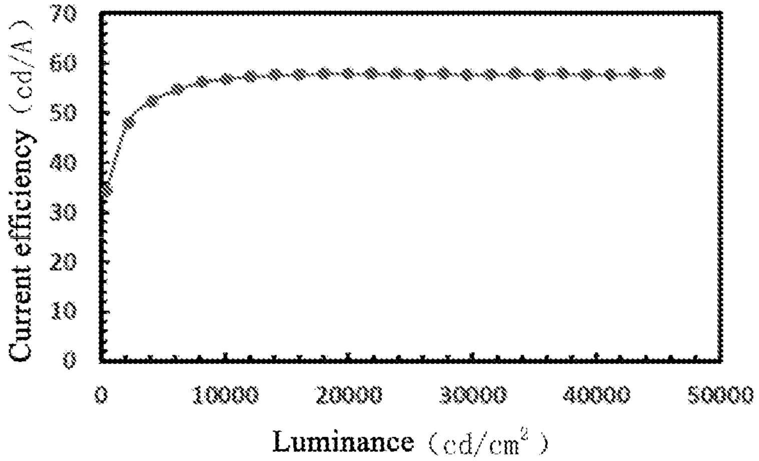
FIG. 6B illustrates a curve of a relationship between a current efficiency and a luminance of a light-emitting device provided in a second embodiment of the present disclosure.
Figure 6C:
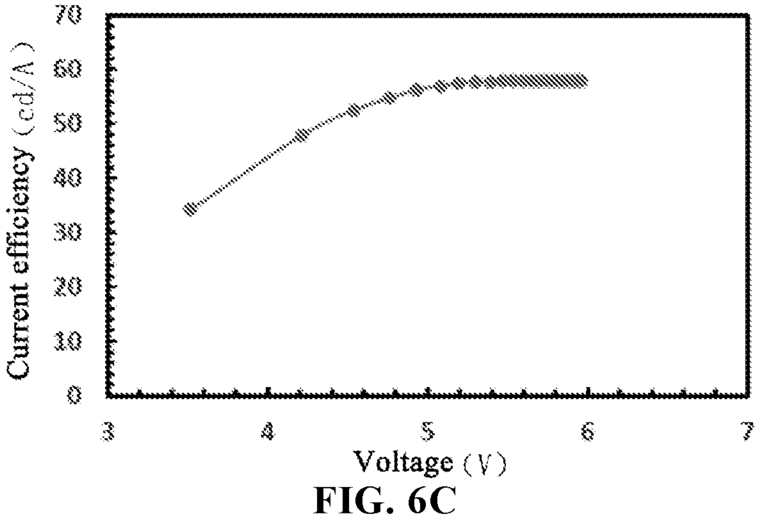
FIG. 6C illustrates a curve of a relationship between a current efficiency and a voltage of a light-emitting device provided in a second embodiment of the present disclosure.

FIG. 6A illustrates a curve of a relationship between a current density and a voltage of a light-emitting device provided in a second embodiment of the present disclosure, FIG. 6B illustrates a curve of a relationship between a current efficiency and a luminance of a light-emitting device provided in a second embodiment of the present disclosure, and FIG. 6C illustrates a curve of a relationship between a current efficiency and a voltage of a light-emitting device provided in a second embodiment of the present disclosure. The light-emitting device in the second embodiment is similar to the light-emitting device in the first embodiment, except that the thicknesses of the intervening layer 30 in the second embodiment is different from that in the first embodiment. Specifically, a Mg metal layer having a thickness of 3 nm is formed on the surface of the electron transport layer 20, such that a part of the Mg metal layer close to the electron transport layer 20 (ZnO layer) forms a second metal oxide layer, and the other part of the electron transport layer 20 remains unchanged.

Figure 7A:
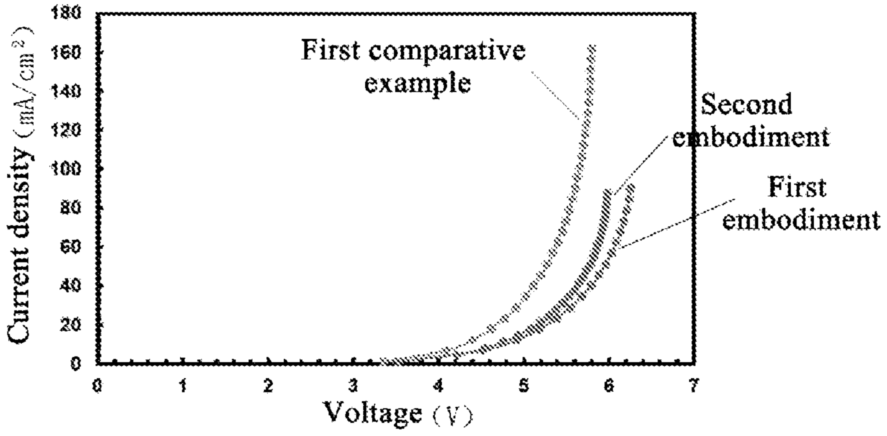
FIG. 7A illustrates a comparison of current density-voltage curves of the light-emitting devices in the first and second embodiments of the present disclosure with the current density-voltage curve of the light-emitting device in the first comparative example.
Figure 7B:
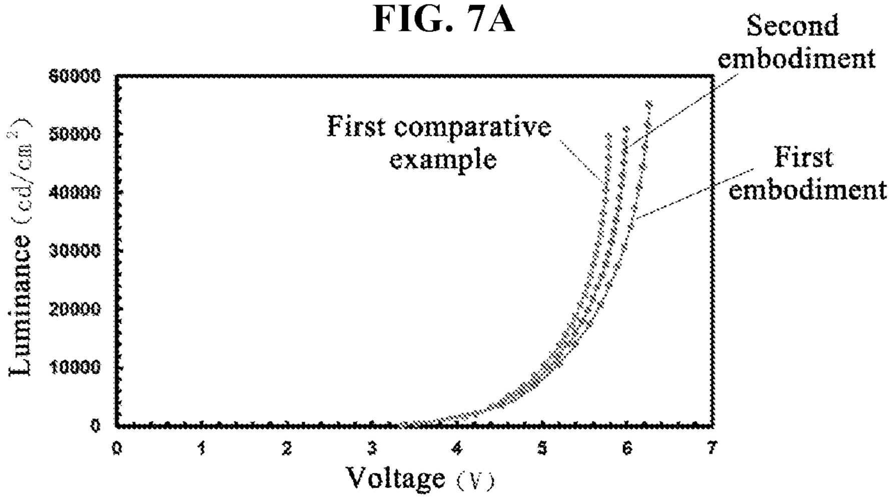
FIG. 7B illustrates a comparison of luminance-voltage curves of the light-emitting devices in the first and second embodiments of the present disclosure with the luminance-voltage curve of the light-emitting device in the first comparative example.
Figure 7C:
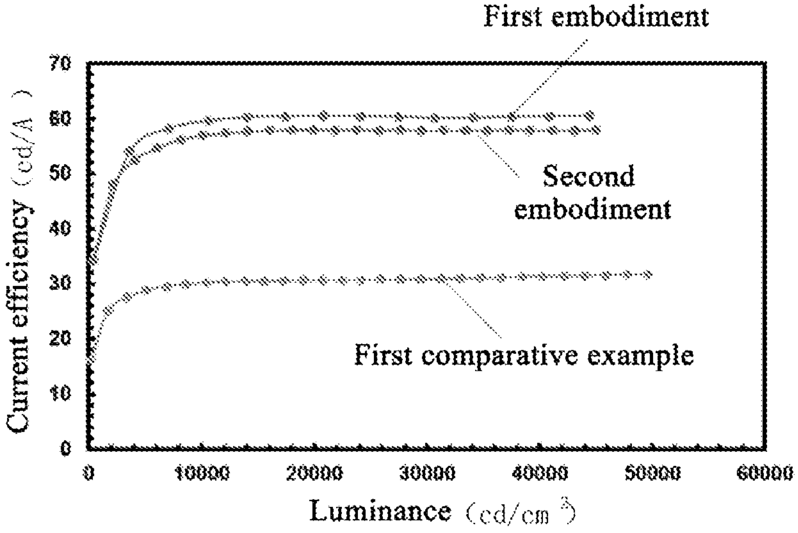
FIG. 7C illustrates a comparison of current efficiency-luminance curves of the light-emitting devices in the first and second embodiments of the present disclosure with current efficiency-luminance curve of the light-emitting device in the first comparative example.

FIG. 7A illustrates a comparison of current density-voltage curves of the light-emitting devices in the first and second embodiments of the present disclosure with the current density-voltage curve of the light-emitting device in the first comparative example; FIG. 7B illustrates a comparison of luminance-voltage curves of the light-emitting devices in the first and second embodiments of the present disclosure with the luminance-voltage curve of the light-emitting device in the first comparative example; and FIG. 7C illustrates a comparison of current efficiency-luminance curves of the light-emitting devices in the first and second embodiments of the present disclosure with current efficiency-luminance curve of the light-emitting device in the first comparative example. It can be seen from FIGS. 3A to 3C and 5A to 7C that the current density of the light-emitting device is reduced where the intervening layer 30 is arranged between the electron transport layer 20 and the light-emitting layer 40, which indicates that the intervening layer 30 can block electrons and reduce the current density of the device. In addition, the current efficiency of the light-emitting device can be improved after the intervening layer 30 is provided, and the current efficiency of the light-emitting device with the intervening layer 30 of 1 nm is higher than the current efficiency of the light-emitting device with the intervening layer 30 of 3 nm, but the difference between the two is not great.

Figure 8A:
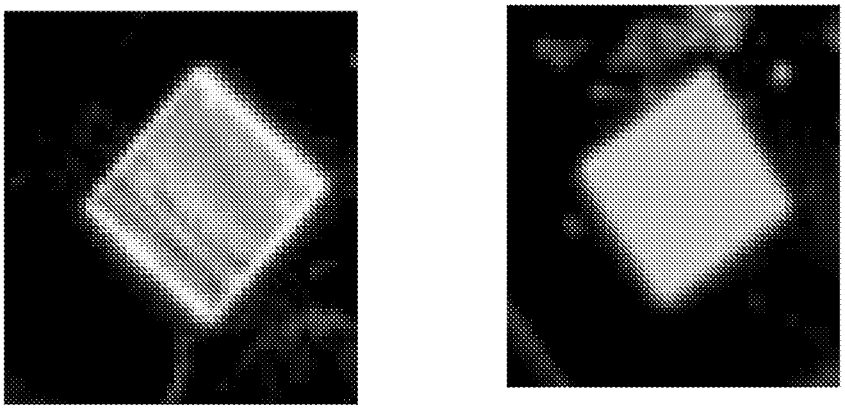
FIG. 8A illustrates a comparison of a light-emitting effect of the light-emitting device in the first comparative example with a light-emitting effect of the light-emitting device in the second embodiment of the present disclosure.

FIG. 8A illustrates a comparison of a light-emitting effect of the light-emitting device in the first comparative example with a light-emitting effect of the light-emitting device in the second embodiment. It can be seen from FIG. 8A that, where the intervening layer 30 is not provided between the electron transport layer 20 and the light-emitting layer 40, the luminance is not uniform at different positions of the light-emitting device, and some stripes are visually observed; where the intervening layer 30 is arranged between the electron transport layer 20 and the light-emitting layer 40, it can be observed that the luminance is kept uniform at different positions of the light-emitting device, and the uniformity of the lateral current is significantly improved.

Figure 8B:
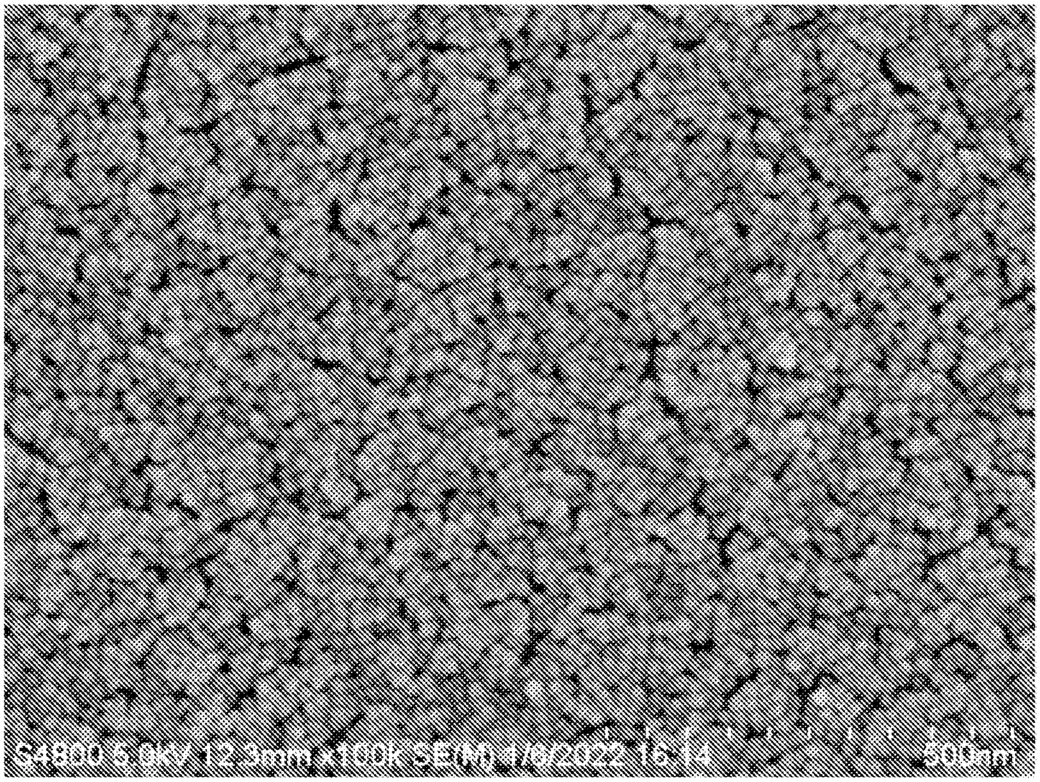
FIG. 8B is a scanning electron micrograph of a surface of an electron transport layer in the first comparative example.
Figure 8C:
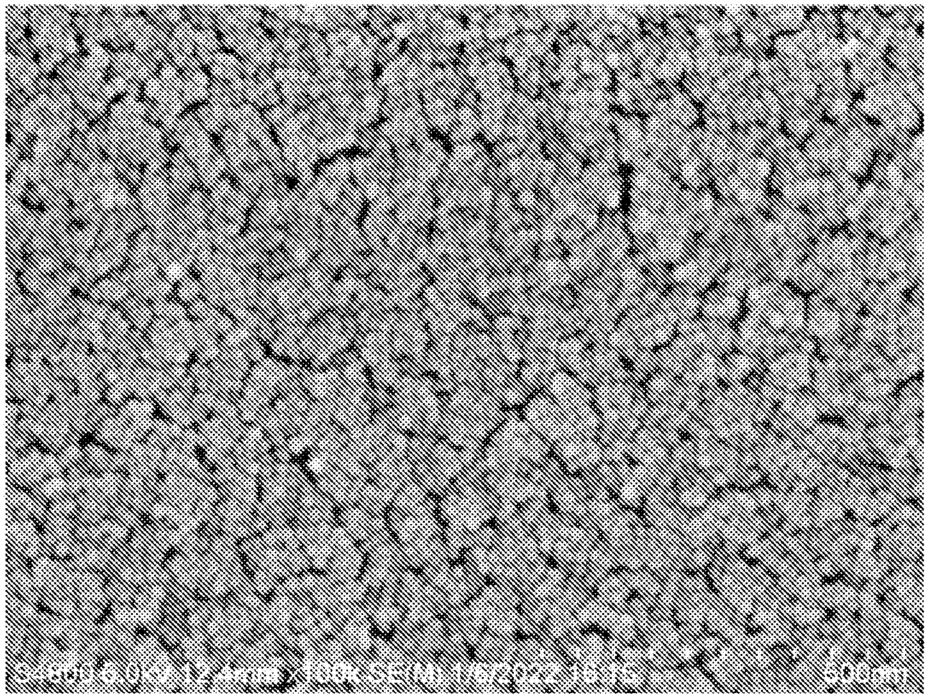
FIG. 8C is a scanning electron micrograph of a surface of the electron transport layer after an intervening layer has been vapor deposited on the surface of the electron transport layer in the second embodiment.

FIG. 8B is a scanning electron micrograph of a surface of an electron transport layer in the first comparative example, and FIG. 8C is a scanning electron micrograph of a surface of the electron transport layer after an intervening layer has been vapor deposited on the surface of the electron transport layer in the second embodiment. As shown in FIGS. 8B and 8C, where the intervening layer 30 is not formed on the surface of the electron transport layer 20, there are many cracks on the surface of the electron transport layer 20, and after the intervening layer 30 is formed, some second metal elements enter the cracks of the electron transport layer 20, but the change of the surface topography is not visually apparent due to a thinness of the intervening layer 30. However, as can be seen from FIGS. 7A to 8A, the current efficiency and the lateral current of the light-emitting device can be improved where the intervening layer 30 is provided.

Figure 9A:
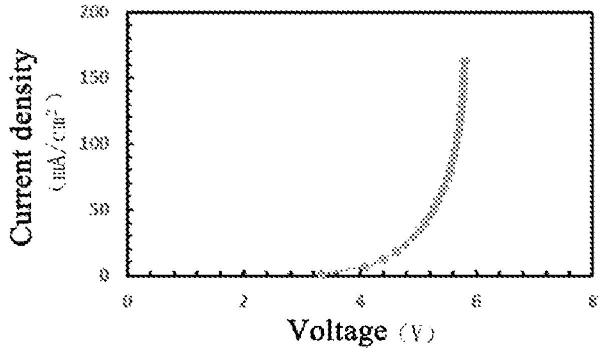
FIG. 9A illustrates a curve of a relationship between a current density and a voltage of a light-emitting device in a third comparative example.
Figure 9B:
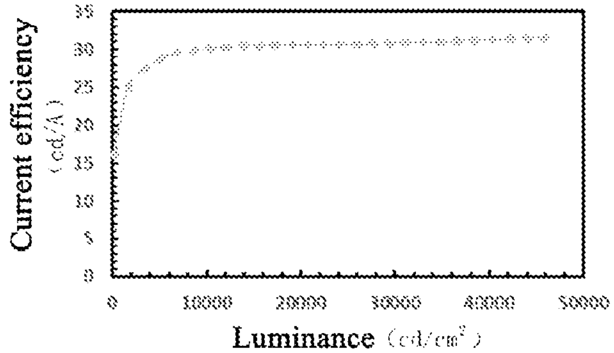
FIG. 9B illustrates a curve of a relationship between a current efficiency and a luminance of a light-emitting device in a third comparative example.
Figure 9C:
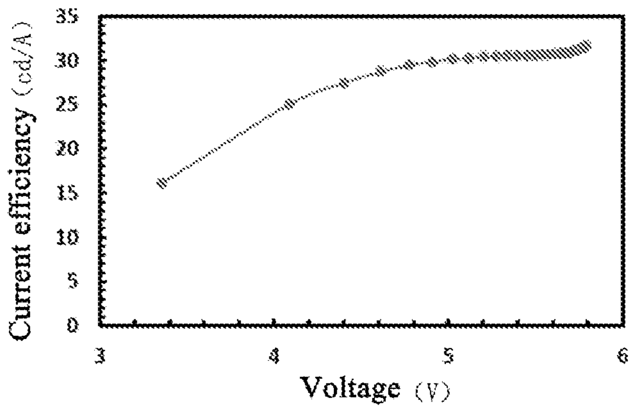
FIG. 9C illustrates a curve of a relationship between a current efficiency and a voltage of a light-emitting device in a third comparative example.

FIG. 9A illustrates a curve of a relationship between a current density and a voltage of a light-emitting device in a third comparative example, FIG. 9B illustrates a curve of a relationship between a current efficiency and a luminance of a light-emitting device in a third comparative example, and FIG. 9C illustrates a curve of a relationship between a current efficiency and a voltage of a light-emitting device in a third comparative example. The light-emitting device in the third comparative example is similar to the light-emitting device in the first embodiment, except that the position and material of the intervening layer 30 in the third example are different from those in the first embodiment. Specifically, the intervening layer 30 is located between the light-emitting layer 40 and the hole transport layer 50, and includes a Mg metal layer.

As can be seen from FIGS. 9A to 9C, where the intervening layer 30 is arranged between the light-emitting layer 40 and the hole transport layer 50, the surface defects of the electron transport layer 20 cannot be improved, and holes are blocked, so that the injection of electrons and the injection of holes are more unbalanced, thereby resulting in a lower current efficiency of the light-emitting device (the maximum value of the current efficiency is not more than 35 cd/A).

The inventors have found that when the thickness of the electron transport layer 20 is great, more defects are prone to exist inside the electron transport layer 20, resulting in low current efficiency of the light-emitting device. In order to improve the current efficiency of the light-emitting device, in some embodiments, the thickness of the electron transport layer 20 is set in a range of 20 nm to 25 nm. For example, the thickness of the electron transport layer 20 is 20 nm, 21 nm, 22 nm, 23, 24 nm, or 25 nm.

A manufacturing process of the electron transport layer 20 includes: spin-coating an electron transport solution, and then solidifying the electron transport solution, to form the electron transport layer 20. Optionally, when forming the electron transport layer 20 with a thickness in a range of 20 nm to 25 nm, a concentration of the electron transport solution may be in a range of 20 mg/mL to 40 mg/mL, and a spin-coating speed may be in a range of 3500 r/min to 4500 r/min.

Figure 10A:
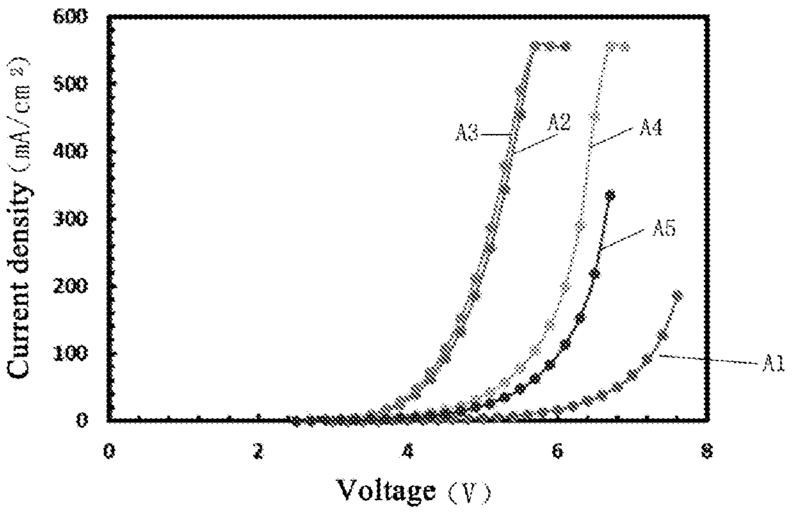
FIG. 10A illustrates current density curves of light-emitting devices having electron transport layers of different thicknesses in some embodiments of the present disclosure.
Figure 10B:
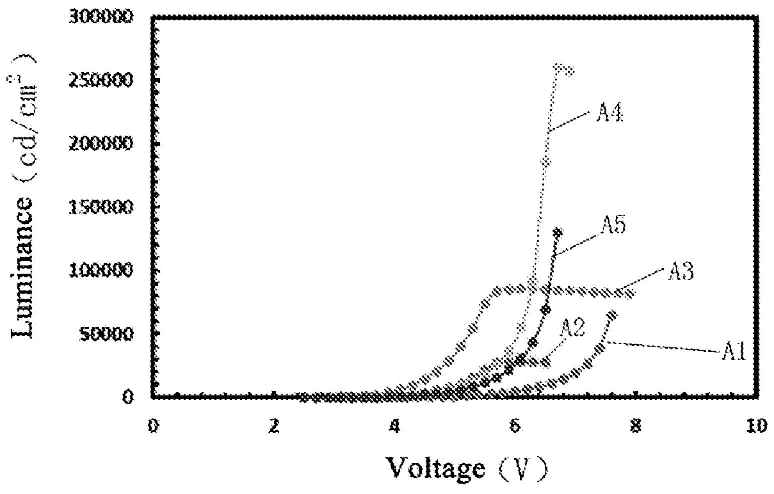
FIG. 10B illustrates voltage-current curves of light-emitting devices having electron transport layers of different thicknesses in some embodiments of the present disclosure.
Figure 10C:
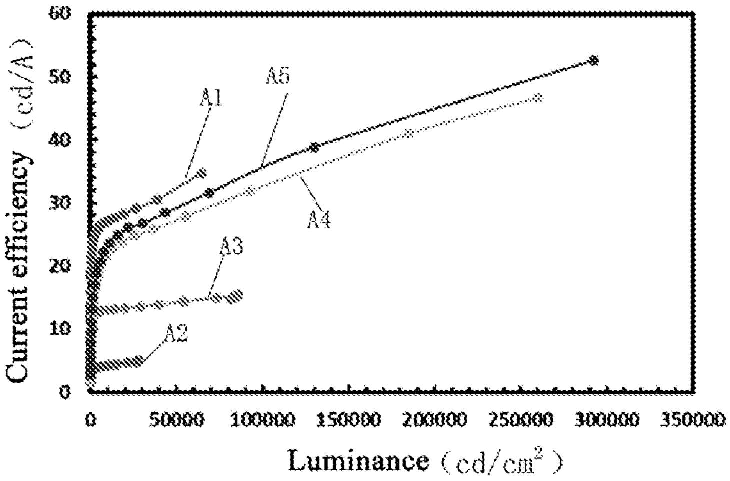
FIG. 10C illustrates luminance-current curves of light-emitting devices having electron transport layers of different thicknesses in some embodiments of the present disclosure.

FIG. 10A illustrates current density curves of light-emitting devices having electron transport layers of different thicknesses in some embodiments of the present disclosure, FIG. 10B illustrates voltage-current curves of light-emitting devices having electron transport layers of different thicknesses in some embodiments of the present disclosure, and FIG. 10C illustrates luminance-current curves of light-emitting devices having electron transport layers of different thicknesses in some embodiments of the present disclosure. In the light-emitting devices A1 to A5, all the electron transport layers 20 are made of a same material, and are made of ZnO nano-material; the light-emitting device A1 does not include the intervening layer 30, each of the light-emitting devices A2 to A5 is provided with the intervening layers 30 with the thickness of 3 nm, the intervening layer 30 includes the second metal oxide layer 31 and the intervening body layer 32, the material of the intervening body layer 32 includes Mg, and the second metal oxide layer 31 is a film formed by Mg and ZnO. The electron transport layers 20 in the light-emitting devices A1 to A5 are all formed through spin-coating. When the electron transport layers 20 in the light-emitting devices A1 and A4 are formed, the spin-coating speed is 3000 r/min, and the thickness of the formed electron transport layer 20 is in a range of 25 nm to 30 nm. When the electron transport layer 20 in the light-emitting device A2 is formed, the spin-coating speed is 1000 r/min, and the thickness of the formed electron transport layer 20 is in a range of 35 nm to 40 nm. When the electron transport layer 20 in the light-emitting device A3 is formed, the spin-coating speed is 2000 r/min, and the thickness of the formed electron transport layer 20 is in a range of 30 nm to 35 nm. When the electron transport layer 20 in the light-emitting device A5 is formed, the spin-coating speed is 4000 r/min, and the thickness of the formed electron transport layer 20 is in a range of 20 nm to 25 nm. As can be seen from FIGS. 10A to 10C, when the same intervening layer 30 is provided in the light-emitting device, the current efficiency of the light-emitting device gradually increases as the thickness of the electron transport layer 20 decreases.

In the embodiments of the present disclosure, the light-emitting device may adopt a top emission structure, or may adopt a bottom emission device. Where the top emission structure is adopted, a light extraction layer may be further arranged on a side of the second electrode 70 away from the first electrode 10, so as to facilitate light to be emitted from the light-emitting device. The light extraction layer may be made of an organic material such as NPB, CBP, TCTA, or the like, and may alternatively be made of an inorganic material such as SiO2, SiOx, or the like.

An embodiment of the present disclosure further provides a manufacturing method of the light-emitting device in the above embodiment. The manufacturing method includes: forming a first electrode, a second electrode, a light-emitting layer, an electron transport layer and an intervening layer, where the first electrode is arranged opposite to the second electrode, the light-emitting layer is arranged between the first electrode and the second electrode, the electron transport layer is arranged between the first electrode and the light-emitting layer, the intervening layer is arranged on a side of the electron transport layer, and the material of the electron transport layer includes a first metal oxide.

The step of forming the intervening layer includes: forming a metal material layer, where the metal material layer includes a second metal element, the activity of the second metal element is greater than the activity of the metal in the first metal oxide, such that the existing form of the second metal element of the metal material layer includes a first form and a second form, the first form includes a form chemically bonded to the first metal oxide, and the second form includes a form of metal simple substance. A content of the second metal element existing in the second form is greater than a content of the second metal element existing in the first form.

Figure 11:
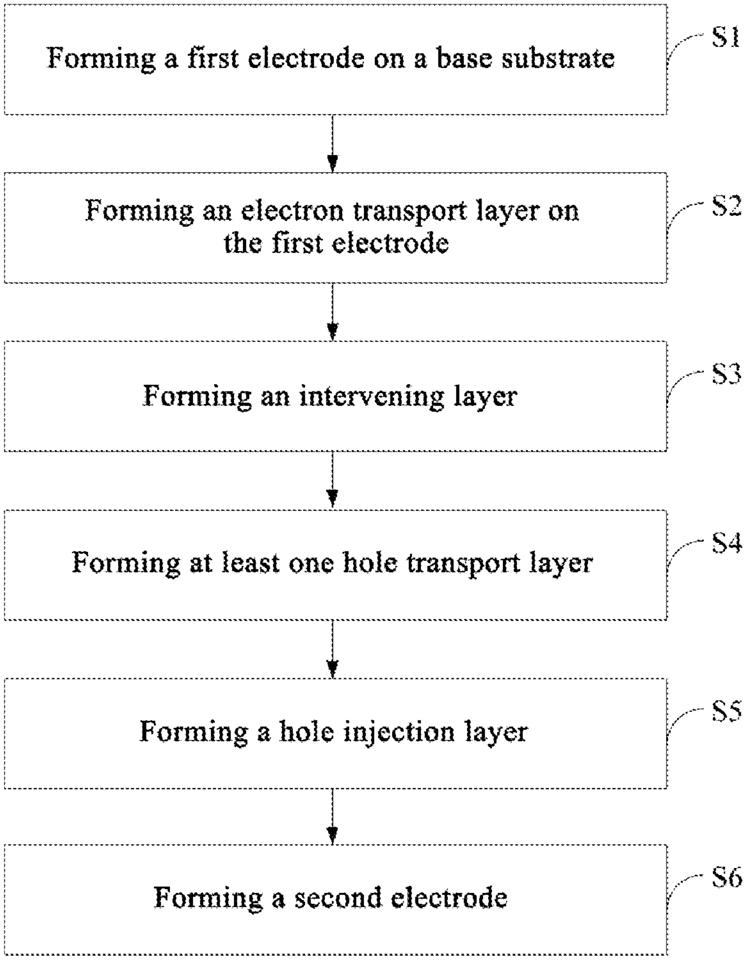
FIG. 11 is a flow chart of a method of manufacturing a light-emitting device provided in some embodiments of the present disclosure.

The following describes a method of manufacturing the light-emitting device, taking a case an example, in which case the second electrode is located on a side of the first electrode away from the base substrate, and the intervening layer is located on a side of the electron transport layer away from the first electrode. FIG. 11 is a flowchart of a method of manufacturing a light-emitting device provided in some embodiments of the present disclosure. As shown in FIG. 11, the method of manufacturing a light-emitting device includes:

S1, forming a first electrode on a base substrate. Optionally, the first electrode is made of a transparent conductive material.

S2, forming an electron transport layer on the first electrode, where the material of the electron transport layer includes a first metal oxide.

Optionally, the first metal oxide includes, but is not limited to, a metal oxide such as ZnO, ZnMgO, ZnAlO, ZnYO, or the like. The thickness of the electron transport layer is in a range of 20 nm to 25 nm, so that the defects inside the electron transport layer are reduced. For example, the electron transport layer may have a thickness of 20 nm, 21 nm, 22 nm, 23 nm, 24 nm, or 25 nm.

Step S2 may specifically include:

S21, spin-coating an electron transport solution, where a concentration of the electron transport solution is in a range of 20 mg/mL to 40 mg/mL, and a spin-coating speed is in a range of 3500 r/min to 4500 r/min. For example, the concentration of the electron transport solution is 30 mg/mL, and the spin-coating speed is 4000 r/min.

S22, solidifying the electron transport solution to form the electron transport layer.

Optionally, the electron transport layer is formed as follows: forming an electron transport solution through spin-coating, and solidifying the electron transport solution to form the electron transport layer.

S3, forming an intervening layer. The intervening layer includes a second metal element, where the existing form of the second metal element in the intervening layer includes a first form and a second form, the first form includes a form chemically bonded to the first metal oxide, and the second form includes a form of a metal simple substance. The content of the second metal element existing in the second form is greater than the content of the second metal element existing in the first form. In some embodiments, the second form further includes a form of a metal oxide corresponding to the second metal element.

Step S3 includes: forming a metal material layer, where the metal material layer includes a second metal element, and the activity of the second metal element is greater than the activity of the metal element in the first metal oxide, so that a part of the second metal elements in the metal material layer react directly in-situ with the first metal oxide to form a second metal oxide layer; and another part of the second metal elements exist in the form of a metal simple substance, and the other part of the second metal elements react with oxygen to form a metal oxide. The metal simple substance and the metal oxide of the second metal element may be co-doped.

The metal material layer is formed through evaporation, so that the metal material layer may be filled into cracks of the electron transport layer and cracks in the subsequently formed light-emitting layer, the lateral current of the light-emitting device is improved, and the light-emitting uniformity is improved.

S4, forming at least one hole transport layer.

Optionally, the hole transport layer is formed through evaporation. The material of each hole transport layer is as described above and will not be repeated herein.

S5, forming a hole injection layer.

Optionally, the hole injection layer is formed through evaporation, and the material of the hole injection layer may include MoOx.

S6, forming a second electrode.

Optionally, the second electrode is formed through evaporation or sputtering, and a material of the second electrode may include one of Mg, Al, and Ag or an alloy of more of Mg, Al, and Ag.

Alternatively, a light extraction layer may be formed after the second electrode is formed, to facilitate light outgoing from the light-emitting device. The light extraction layer may be made of an organic material such as NPB, CBP, or TCTA, or an inorganic material such as $SiO_2$ or SiOx.

An embodiment of the present disclosure further provides a display substrate including the light-emitting device in the above embodiment.

The display substrate includes a base substrate, and a driving circuit layer, a planarization layer and a pixel definition layer are arranged on the base substrate. The driving circuit layer may include a plurality of pixel circuits. The planarization layer is arranged on a side of the pixel circuits away from the base substrate. The pixel definition layer is arranged on a side of the planarization layer away from the base substrate, and the pixel definition layer is provided with a plurality of accommodating parts, and the light-emitting devices are arranged in the accommodating parts in a one-to-one correspondence. The first electrode of the light-emitting device is connected to the pixel circuit through a via in the planarization layer, so that the light-emitting device emits light under the driving of the pixel circuit.

An embodiment of the present disclosure further provides a display apparatus, which includes the display substrate describe above.

The display apparatus may be any product or component having a display function, such as an electronic paper, a QLED panel, a mobile phone, a tablet computer, a television, a monitor, a notebook computer, a digital photo frame, a navigator, or the like.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications are to be considered within the scope of the present disclosure.

What is claimed is:

1. A light-emitting device, comprising a first electrode and a second electrode opposite to each other, and a light-emitting layer and an electron transport layer between the first electrode and the second electrode, wherein the electron transport layer is between the first electrode and the light-emitting layer, wherein a material of the electron transport layer comprises a first metal oxide, the light-emitting device further comprises an intervening layer on a side of the electron transport layer, the intervening layer comprising a second metal element, wherein an existing form of the second metal element in the intervening layer comprises a first form and a second form, the first form comprises a chemically bonded form, in which the second metal element is chemically bonded to the first metal oxide, and the second form comprises a form of a metal simple substance; wherein a content of the second metal element in the second form is greater than a content of the second metal element in the first form; and the second metal element has an activity greater than an activity of the metal element in the first metal oxide.

2. The light-emitting device according to claim 1, wherein the first metal oxide comprises at least one of ZnO, ZnMgO, ZnAlO, and ZnYO, and the second metal element comprises at least one of K, Ca, Na, Mg and Al.

3. The light-emitting device according to claim 2, wherein a content of the second metal element in the intervening layer gradually increases in a direction away from the electron transport layer.

4. The light-emitting device according to claim 2, wherein a molar ratio of the content of the second metal element in the chemically bonded form to a total amount of the second metal element in the intervening layer is in a range of 20% to 30%.

5. The light-emitting device according claim 2, wherein the second form further comprises a form of a metal oxide corresponding to the second metal element.

6. The light-emitting device according to claim 2, wherein the second metal elements in the chemically bonded form constitute a discontinuous layer.

7. The light-emitting device according to claim 1, wherein a content of the second metal element in the intervening layer gradually increases in a direction away from the electron transport layer.

8. The light-emitting device according to claim 1, wherein a molar ratio of the content of the second metal element in the chemically bonded form to a total amount of the second metal element in the intervening layer is in a range of 20% to 30%.

9. The light-emitting device according to claim 1, wherein the second form further comprises a form of a metal oxide corresponding to the second metal element.

10. The light-emitting device according to claim 1, wherein the second metal elements in the chemically bonded form constitute a discontinuous layer.

11. The light-emitting device according to claim 1, wherein a roughness of a surface of the electron transport layer close to the intervening layer is a, and a thickness of the intervening layer is greater than or equal to a.

12. The light-emitting device according to claim 11, wherein a difference between the thickness of the intervening layer and a is less than or equal to 2 nm.

13. The light-emitting device according to claim 1, wherein a thickness of the electron transport layer is in a range of 20 nm to 25 nm.

14. The light-emitting device according to claim 1, further comprising at least one hole transport layer between the light-emitting layer and the second electrode, wherein a material of each of the at least one hole transport layer comprises at least one of the following compounds and derivatives of the following compounds:

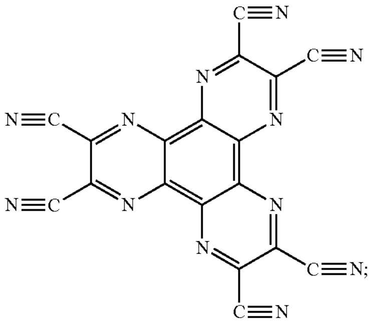

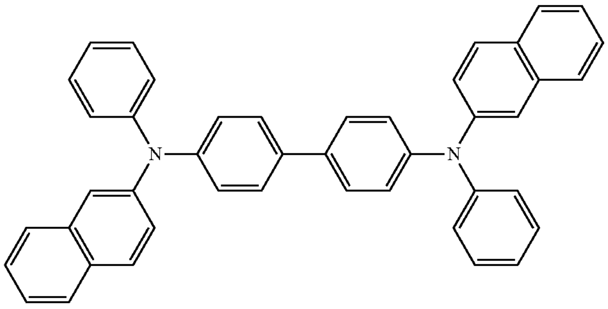
;

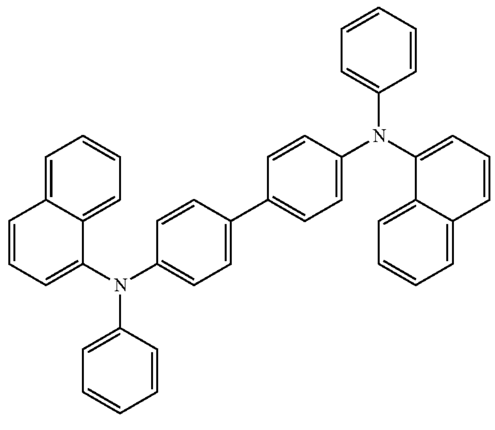
;

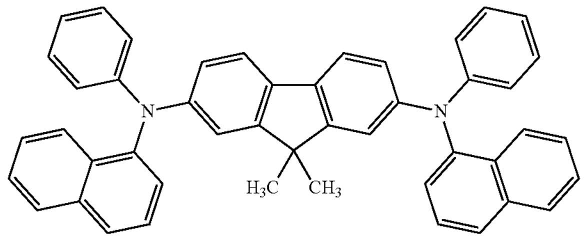
;

-continued
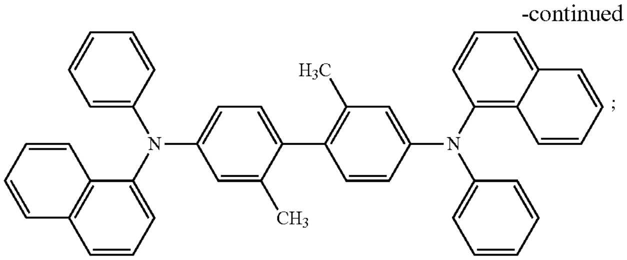
;
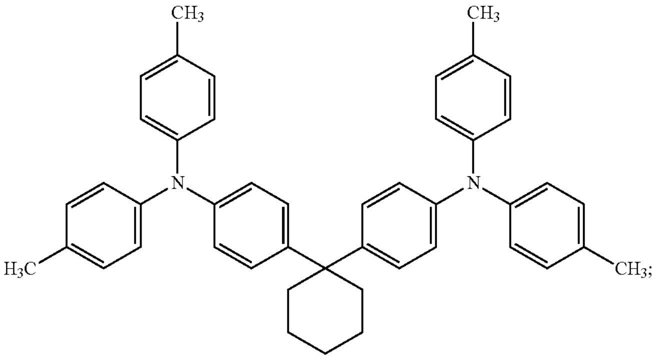
;
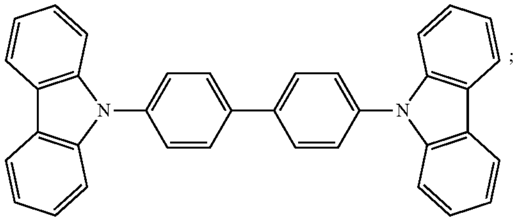
;
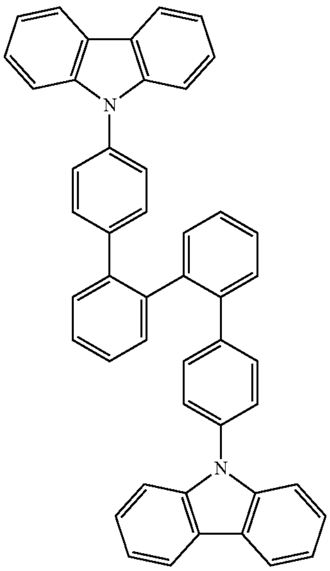
;
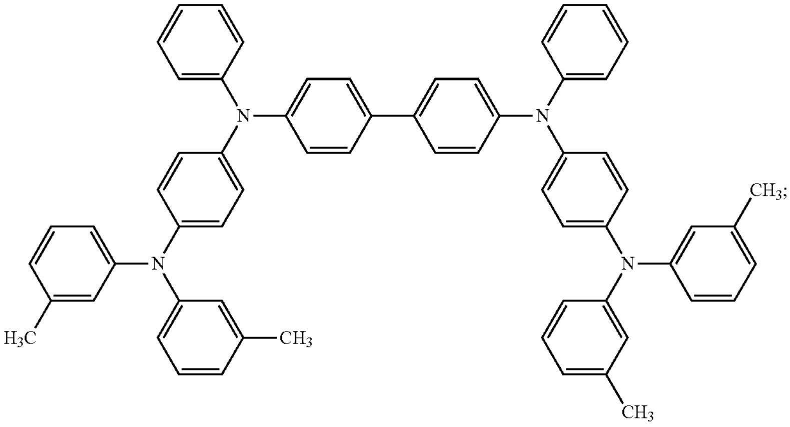
;

-continued

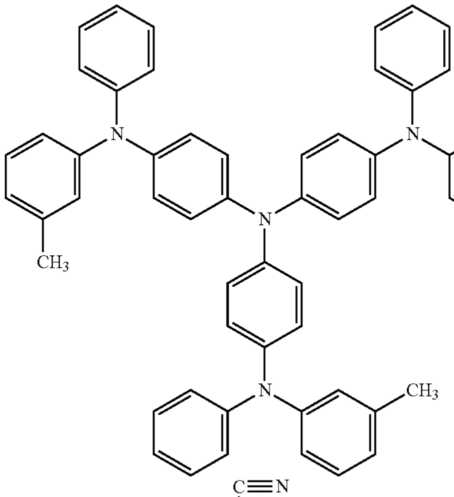

;

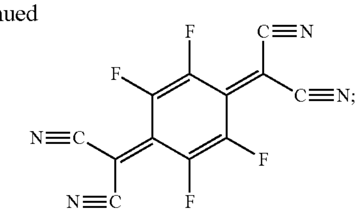

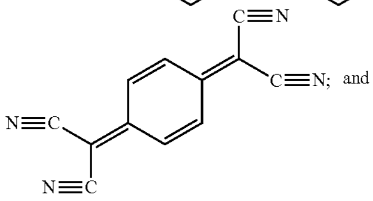

and

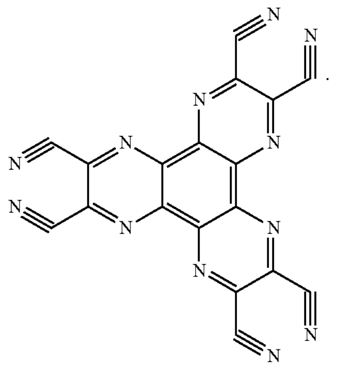

.

15. A display substrate, comprising the light-emitting device according to claim 1.

16. A display apparatus, comprising the display substrate according to claim 15.

17. A method of manufacturing a light-emitting device, comprising:

forming a first electrode, a second electrode, a light-emitting layer, an electron transport layer and an intervening layer, wherein the first electrode and the second electrode are opposite to each other, the light-emitting layer is between the first electrode and the second electrode, the electron transport layer is between the first electrode and the light-emitting layer, the intervening layer is on a side of the electron transport layer, and a material of the electron transport layer comprises a first metal oxide;

wherein a step of forming the intervening layer comprises:

forming a metal material layer, wherein the metal material layer comprises a second metal element, and the second metal element has an activity greater than an activity of a metal element in the first metal oxide, such that an existing form of the second metal element of the metal material layer comprises a first form and a second form, the first form comprises a form chemically bonded to the first metal oxide, and the second form comprises a form of a metal simple substance;

wherein a content of the second metal element in the second form is greater than a content of the second metal element in the first form.

18. The method according to claim 17, wherein the metal material layer is formed through evaporation.

19. The method according to claim 17, wherein the electron transport layer has a thickness in a range of 20 nm to 25 nm.

20. The method according to claim 19, wherein a step of forming the electron transport layer comprises:

spin-coating an electron transmission solution, wherein a concentration of the electron transmission solution is in a range of 20 mg/mL to 40 mg/mL, and a spin-coating speed is in a range of 3500 r/min to 4500 r/min; and solidifying the electron transport solution, to form the electron transport layer.

* * * * *